US009068153B2

(12) United States Patent
Takahashi et al.

(10) Patent No.: US 9,068,153 B2
(45) Date of Patent: Jun. 30, 2015

(54) CLEANING COMPOSITION, CLEANING PROCESS, AND PROCESS FOR PRODUCING SEMICONDUCTOR DEVICE

(75) Inventors: Tomonori Takahashi, Shizuoka (JP); Kazutaka Takahashi, Shizuoka (JP); Atsushi Mizutani, Shizuoka (JP); Hiroyuki Seki, Shizuoka (JP); Hideo Fushimi, Shizuoka (JP); Tomoo Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 255 days.

(21) Appl. No.: 12/893,964

(22) Filed: Sep. 29, 2010

(65) Prior Publication Data

US 2011/0076852 A1 Mar. 31, 2011

(30) Foreign Application Priority Data

Sep. 30, 2009 (JP) ................................. 2009-226698
May 20, 2010 (JP) ................................. 2010-116623

(51) Int. Cl.
*C09K 13/06* (2006.01)
*C11D 11/00* (2006.01)
*C11D 7/08* (2006.01)
*C11D 7/50* (2006.01)

(52) U.S. Cl.
CPC .............. *C11D 11/0047* (2013.01); *C11D 7/08* (2013.01); *C11D 7/5013* (2013.01)

(58) Field of Classification Search
CPC ........ C09K 13/00; C09K 13/06; G03F 7/425; G03F 7/423; G03F 7/426
See application file for complete search history.

(56) References Cited

U.S. PATENT DOCUMENTS

| 5,279,771 | A | 1/1994 | Lee |
| 5,419,779 | A | 5/1995 | Ward |
| 5,630,904 | A | 5/1997 | Aoyama et al. |
| 7,375,066 | B2* | 5/2008 | Kakizawa et al. ............ 510/175 |
| 2004/0038840 | A1* | 2/2004 | Lee et al. ...................... 510/202 |
| 2005/0181961 | A1 | 8/2005 | Misra et al. |
| 2005/0287480 | A1* | 12/2005 | Takashima ................... 430/331 |
| 2006/0115970 | A1* | 6/2006 | Lee .............................. 438/584 |

FOREIGN PATENT DOCUMENTS

| CN | 1677248 A | 10/2005 |
| JP | 4147320 B2 | 2/2001 |
| JP | 3513491 B2 | 10/2001 |
| JP | 3871257 B2 | 4/2003 |
| JP | 2005-194294 A | 7/2005 |

(Continued)

OTHER PUBLICATIONS

Extended European Search Report dated Jan. 19, 2011 on EP Application No. 10177316.6.

(Continued)

*Primary Examiner* — Lan Vinh
*Assistant Examiner* — Jiong-Ping Lu
(74) *Attorney, Agent, or Firm* — Sughrue Mion, PLLC (57) ABSTRACT

A cleaning composition for removing plasma etching residue and/or ashing residue formed above a semiconductor substrate is provided that includes (component a) water, (component b) a hydroxylamine and/or a salt thereof, (component c) a basic organic compound, and (component d) an organic acid and has a pH of 7 to 9. There are also provided a cleaning process and a process for producing semiconductor device employing the cleaning composition.

17 Claims, 2 Drawing Sheets

(56) References Cited

FOREIGN PATENT DOCUMENTS

| | | | |
|---|---|---|---|
| JP | 2005-292288 A | 10/2005 | |
| JP | 2007-003617 A | 1/2007 | |
| JP | 2008-528762 A | 7/2008 | |
| JP | 2008-191624 A | 8/2008 | |
| JP | 2009-013417 A | 1/2009 | |
| WO | 98/10050 A1 | 3/1998 | |
| WO | 98/36045 A1 | 8/1998 | |
| WO | WO9836045 * | 8/1998 | ............... C11D 3/18 |
| WO | 98/40453 A1 | 9/1998 | |
| WO | 99/15345 A1 | 4/1999 | |
| WO | 01/36578 A1 | 5/2001 | |
| WO | 03/091376 A1 | 11/2003 | |
| WO | WO03091376 * | 11/2003 | ............... C11D 3/20 |
| WO | WO2008080097 * | 7/2008 | ............... C11D 7/28 |

OTHER PUBLICATIONS

Database WPI, Week 200716, Thomson Scientific, London, GB; AN 2007-154901, XP002615170 (Abstract of JP2007-003617A).

Office Action dated Nov. 26, 2013 in Japanese Application No. 2010-116623.

Office Action dated Sep. 2, 2014, from the Japanese Patent Office in counterpart Japanese Application No. 2010-116623.

Office Action mailed Jan. 5, 2015 from the Taiwanese Patent Office in counterpart Taiwanese Application No. 099131316.

* cited by examiner

CLEANING COMPOSITION, CLEANING PROCESS, AND PROCESS FOR PRODUCING SEMICONDUCTOR DEVICE

BACKGROUND OF THE INVENTION

1. Field of the Invention

The present invention relates to a novel cleaning composition for use in microelectronics manufacturing and a cleaning process and a process for producing a semiconductor device that employ the cleaning composition, and more particularly to a non-corrosive cleaning composition for removing plasma etching residues formed on wafer substrates after plasma etching of metal layers or oxide layers deposited on the substrates and a cleaning process and a process for producing a semiconductor device that employ the cleaning composition.

2. Description of the Related Art

In the manufacture of microcircuits, positive photoresists are used as an intermediate mask for transferring an original mask pattern of a reticule onto wafer substrates by means of a series of photolithography and plasma etching steps. One of the final steps in the microcircuit manufacturing process is the removal of the patterned photoresist films from the substrates. In general, this step is affected by one of two methods. One method involves a wet stripping step in which the photoresist-covered substrate is brought into contact with a photoresist stripper solution that consists primarily of an organic solvent and an amine. However, stripper solutions cannot completely and reliably remove the photoresist films, especially if the photoresist films have been exposed to UV radiation and plasma treatments during fabrication. Some photoresist films become degenerated by such treatments and are more difficult to dissolve in the stripper solution. In addition, the chemicals used in these conventional wet stripping methods are sometimes ineffective for removing inorganic residual materials formed during the plasma etching of metal or oxide layers with halogen-containing gases.

An alternative method of removing a photoresist film involves exposing a photoresist-coated wafer to oxygen-based plasma in order to burn the resist film from the substrate surface in a process known as plasma ashing. Plasma ashing has become more popular in the microcircuit manufacturing process because it is carried out in a vacuum chamber and, hence, is expected to be less susceptible to airborne particulate or metallic contamination.

However, plasma ashing is also not fully effective in removing the plasma etching by-products noted above. Instead, removal of these plasma etching by-products must be accomplished by subsequently exposing the photoresist film to certain cleaning solutions. Several commercial products are now available to clean the plasma etching by-products left by plasma etching followed by plasma ashing. For example, EKC 265, available from EKC Technology, Inc., is a post etching cleaning solution composed of water, alkanolamine, catechol and hydroxylamine. Such a composition is disclosed in U.S. Pat. No. 5,279,771 to Lee. ACT 935, available from Ashland Chemical, is another post etching cleaning solution and is composed of water, alkanolamine and hydroxylamine. Such a composition is disclosed in U.S. Pat. No. 5,419,779 to Ward. ELM C-30, available from Mitsubishi Gas Chemical, is composed of water, N,N-dimethylformamide, a fluorine compound, organic carboxylate, and a sugar alcohol, wherein the sugar alcohol acts as a corrosion inhibitor. Such a composition is disclosed in U.S. Pat. No. 5,630,904 to Aoyama et al.

These commercial products can effectively dissolve plasma etching residues, however, they can also attack the metallic and oxide layers deposited patternwise on the substrate. This is because the pH of EKC 265 and ACT 935 is above 11 and ELM C-30 contains a fluorine compound. The corrosion inhibitors used in these products are not completely effective in stopping corrosion, because metal layers such as copper, aluminum or aluminum alloys (e.g., Al—Cu—Si), and the like are particularly corrosion sensitive. Furthermore, while the addition of a suitable corrosion inhibitor is essential to prevent corrosion of the substrate metal layers, some corrosion inhibitors tend to inhibit the removal of the plasma etching residue and/or form an insoluble film deposited on the metal substrate surface.

Therefore, there remains a need for a new type of cleaning composition for removing plasma etching residues from substrates. Additionally, there remains a need for such a cleaning composition that does not deleteriously affect the substrate. Further, there remains a need for such a cleaning composition that is aqueous-based, non-hazardous and will not harm the environment.

With respect to corrosion of copper, aluminum, an aluminum alloy, etc., Honda et al. have devised a cleaning composition comprising (a) water, (b) a hydroxylammonium compound, (c) a basic compound, and (d) an organic carboxylic acid. This enables corrosion prevention to be achieved while maintaining cleaning properties. This is described in Japanese registered patent No. 3871257.

Furthermore, Honda et al. have constructed corrosion prevention techniques as disclosed in Japanese registered patent Nos. 3513491 and 4147320.

The techniques described in Japanese registered patent Nos. 3871257, 3513491, and 4147320 disclosed by Honda et al. employ a water-based composition, and enable not only metal corrosion to be prevented but also harm to the environment to be avoided.

However, accompanying recent progress in semiconductor substrate production technology, since integrated circuits having various metal layers and insulating film layers (aluminum, aluminum/silicon/copper, titanium, titanium nitride, titanium/tungsten, tungsten, silicon oxide, polysilicon crystal, etc.) are fabricated, the composition of a plasma etching residue is complicated, and there are cases in which its removal cannot be carried out sufficiently. There is therefore a desire for a cleaning composition that removes such residue without causing a problem with metal corrosion.

BRIEF SUMMARY OF THE INVENTION

As described above, accompanying technological progress, the structure formed above a semiconductor substrate employs wiring structures or interlayer insulating structures having various chemical compositions, and the properties of a residue occurring during ashing for removing a resist used as a mask when carrying out plasma etching also change. A cleaning composition for removing the residue occurring during plasma etching or ashing needs to sufficiently remove residue and not damage the wiring structure or the interlayer insulating structure.

It is an object of the present invention to provide a cleaning composition that can sufficiently remove plasma etching residue or ashing residue above a semiconductor substrate without damaging a wiring structure or an interlayer insulating structure, and a cleaning process and a process for producing a semiconductor device that employ the cleaning composition.

The object can be attained by means described in <1>, <20>, <21> or <23> below. They are described below together with <2> to <19>, <22> and <24>, which are preferred embodiments.

<1> A cleaning composition for removing plasma etching residue and/or ashing residue formed above a semiconductor substrate, the composition comprising: (component a) water; (component b) a hydroxylamine and/or a salt thereof; (component c) a basic organic compound; and (component d) an organic acid; the composition having a pH of 7 to 9, <2> the cleaning composition according to <1> above, wherein component a is contained at 50 to 99.5 wt % relative to the total weight of the cleaning composition, <3> the cleaning composition according to <1> or <2> above, wherein component b is at least one compound selected from the group consisting of a hydroxylamine, a hydroxylamine sulfate, a hydroxylamine hydrochloride, a hydroxylamine nitrate, and a hydroxylamine phosphate, <4> the cleaning composition according to <3> above, wherein component b is a hydroxylamine sulfate, <5> the cleaning composition according to <1> to <4> above, wherein component b is contained at 0.01 to 30.0 wt % relative to the total weight of the cleaning composition, <6> the cleaning composition according to any one of <1> to <5> above, wherein component c is at least one compound selected from the group consisting of an organic amine and a quaternary ammonium hydroxide, <7> the cleaning composition according to <6> above, wherein component c is an organic amine having no hydroxy group, <8> the cleaning composition according to <6> above, wherein component c is a tetraalkylammonium hydroxide, <9> the cleaning composition according to any one of <1> to <8> above, wherein component c is contained at 0.01 to 20.0 wt % relative to the total weight of the cleaning composition, <10> the cleaning composition according to any one of <1> to <9> above, wherein component d is a monofunctional, difunctional, trifunctional, or tetrafunctional organic acid, <11> the cleaning composition according to <10> above, wherein component d is at least one compound selected from the group consisting of citric acid, lactic acid, acetic acid, propionic acid, malic acid, tartaric acid, malonic acid, oxalic acid, succinic acid, gluconic acid, glycolic acid, diglycolic acid, maleic acid, benzoic acid, phthalic acid, salicylic acid, salicylhydroxamic acid, and phthalhydroxamic acid, <12> the cleaning composition according to <10> above, wherein component d is a hydroxycarboxylic acid, <13> the cleaning composition according to <12> above, wherein component d is at least one compound selected from the group consisting of citric acid, malic acid, tartaric acid, glycolic acid, gluconic acid, and lactic acid, <14> the cleaning composition according to any one of <1> to <13> above, wherein component d is contained at 0.01 to 20.0 wt % relative to the total weight of the cleaning composition, <15> the cleaning composition according to any one of <1> to <14> above, wherein the pH is 7.0 to 8.5, <16> the cleaning composition according to <15> above, wherein the pH is 7.2 to 8.4, <17> the cleaning composition according to any one of <1> to <16> above, wherein it further comprises (component e) an amino group-containing carboxylic acid, <18> the cleaning composition according to <17> above, wherein component e is histidine and/or arginine, <19> the cleaning composition according to <17> or <18> above, wherein component e is contained at 0.01 to 5.0 wt % relative to the total weight of the cleaning composition, <20> Use of the cleaning composition according to any one of <1> to <19> above as a cleaning composition for removing plasma etching residue and/or ashing residue, <21> a cleaning process comprising: a preparation step of preparing the cleaning composition according to any one of <1> to <19> above; and a cleaning step of cleaning, by means of the cleaning composition, plasma etching residue and/or ashing residue formed above a semiconductor substrate, <22> the cleaning process according to <21> above, wherein the semiconductor substrate comprises aluminum and/or copper, <23> a process for producing a semiconductor device, the process comprising: an etching step of subjecting a semiconductor substrate to plasma etching; and/or, an ashing step of subjecting a resist above the semiconductor substrate to ashing; and a cleaning step of cleaning, by means of the cleaning composition according to any one of <1> to <19> above, plasma etching residue and/or ashing residue formed above the semiconductor substrate in the etching step and/or the ashing step, and <24> the process for producing a semiconductor device according to <23> above, wherein the semiconductor substrate comprises aluminum and/or copper.

EXPLANATION OF REFERENCE NUMERALS AND SYMBOLS

10 Semiconductor substrate
12 Al alloy film
14 Titanium nitride film
16 Wiring
18 Silicon oxide film
20 Via hole
22 Via hole
24 Interlayer insulating film
26 Titanium nitride film
28 Titanium film
30 Al alloy film
32 Titanium nitride film
34 Wiring
36 Residue (plasma etching residue and ashing residue)

DETAILED DESCRIPTION OF THE INVENTION

In a process for producing a semiconductor device, a metal layer, a semiconductor layer, an insulating layer, etc. above a semiconductor substrate is etched by plasma etching employing a resist pattern, etc. as a mask, thus patterning the metal layer or the semiconductor layer or forming an opening such as a via hole or a wiring trench in the insulating layer.

In the above-mentioned plasma etching, residue derived from the resist used as a mask or from the metal layer, the semiconductor layer, or the insulating layer that are etched occurs above the semiconductor substrate. In the present invention, such residue occurring during plasma etching is called 'plasma etching residue'.

Furthermore, the resist pattern used as a mask is removed after etching. For removal of a resist pattern, a wet method in which a stripper solution is used or a dry method in which ashing employing, for example, plasma or ozone, etc. is involved is used.

In the above-mentioned ashing, residue that is produced as a result of degeneration of plasma etching residue produced by plasma etching or residue that is derived from the resist that is being removed occurs above the semiconductor substrate. In the present invention, the residue thus formed by ashing is called 'ashing residue'.

Plasma etching residue or ashing residue, which is residue after etching (Post Etch Residue), is cleaned and removed by use of a cleaning composition. The cleaning composition of the present invention is for removing plasma etching residue formed by plasma etching and/or ashing residue formed by ashing.

The cleaning composition of the present invention may be used for removing either one of plasma etching residue or ashing residue, but is preferably used for removing plasma etching residue and ashing residue after ashing, which is carried out subsequent to plasma etching.

The present invention is explained in detail below. In the present invention, the notation 'A to B', which expresses a numerical range, means 'at least A but no greater than B' unless otherwise specified, and means a numerical range including end points A and B.

(Cleaning Composition)

The cleaning composition of the present invention comprises (component a) water, (component b) a hydroxylamine and/or a salt thereof, (component c) a basic organic compound, and (component d) an organic acid, the composition having a pH of 7 to 9, and is for removing plasma etching residue and/or ashing residue formed above a semiconductor substrate.

(Component a) to (component d), which are essential components of the cleaning composition of the present invention, and the pH are explained in sequence below.

(Component a) Water

The cleaning composition of the present invention is an aqueous solution containing water as a solvent. The content of water is preferably 50 to 99.5 wt % relative to the total weight of the cleaning composition. In this way, the cleaning composition having water as a main component is preferable in terms of the environment not being harmed compared with a conventional cleaning composition having a high ratio of an organic solvent.

As water, ultrapure water used for semiconductor production is preferable.

(Component b) Hydroxylamine and/or Salt Thereof

The cleaning composition of the present invention comprises at least one hydroxylamine and/or salt thereof. The salt of a hydroxylamine is preferably an inorganic acid salt or organic acid salt of a hydroxylamine, more preferably an inorganic acid salt that is formed by bonding between hydrogen and a nonmetal such as Cl, S, N, or P, and yet more preferably a salt of any one of hydrochloric acid, sulfuric acid, and nitric acid.

Examples of the salt of a hydroxylamine that may be used in the present invention include hydroxylamine nitrate (also called HAN), hydroxylamine sulfate (also called HAS), hydroxylamine phosphate, and hydroxylamine hydrochloride.

In the cleaning composition, an organic acid salt of a hydroxylamine may also be used, and examples thereof include hydroxylamine citrate and hydroxylamine oxalate.

Among these salts of a hydroxylamine, inorganic acid salts such as hydroxylamine nitrate, hydroxylamine sulfate, hydroxylamine phosphate, and hydroxylamine hydrochloride are preferable since they are inactive toward a metal such as aluminum, copper, or titanium. In particular, hydroxylamine nitrate and hydroxylamine sulfate are preferable.

With regard to these hydroxylamines and/or salts thereof, one type thereof may be used on its own or two or more types may be used as a mixture.

The hydroxylamine and/or salt thereof is preferably contained at about 0.01 to about 30 wt % relative to the total weight of the cleaning composition of the present invention, and more preferably 0.1 to 15 wt %.

The hydroxylamine and/or salt thereof makes removal of plasma etching residue easy and prevents corrosion of a metal substrate.

(Component c) Basic Organic Compound

The cleaning composition of the present invention comprises a basic organic compound.

The basic organic compound preferably has carbon and nitrogen as constituent elements, and more preferably has an amino group. Specifically, the basic organic compound is preferably at least one compound selected from the group consisting of an organic amine and a quaternary ammonium hydroxide. The organic amine referred to here means an amine containing carbon as a constituent element.

The number of carbon atoms of the basic organic compound is preferably 4 to 30, and from the viewpoint of boiling point and solubility in water more preferably 6 to 16.

The organic amine used as the basic organic compound of the cleaning composition of the present invention includes an alkanolamine such as monoethanolamine, diethanolamine, triethanolamine, diethylene glycolamine, or N-hydroxyethylpiperazine and/or an organic amine having no hydroxy group such as ethylamine, benzylamine, diethylamine, n-butylamine, 3-methoxypropylamine, tert-butylamine, n-hexylamine, cyclohexylamine, n-octylamine, 2-ethylhexylamine, o-xylenediamine, m-xylylenediamine, 1-methyl butylamine, ethylenediamine (EDA), 1,3-propanediamine, 2-aminobenzylamine, N-benzylethylenediamine, diethylenetriamine, or triethylenetetramine. From the viewpoint of preventing corrosion of a metal, an organic amine having no hydroxy group is preferred over an alkanolamine. Furthermore, ethylenediamine, 1,3-propanediamine, o-xylenediamine, and m-xylylenediamine are particularly preferable since they can coordinate to a metal.

The quaternary ammonium hydroxide used as the basic organic compound of the cleaning composition of the present invention is preferably a tetraalkylammonium hydroxide, and more preferably a tetraalkylammonium hydroxide substituted with a lower (1 to 4 carbon atom) alkyl group; specific examples thereof include tetramethylammonium hydroxide (TMAH), tetraethylammonium hydroxide (TEAH), tetrapropylammonium hydroxide (TPAH), and tetrabutylammonium hydroxide (TBAH). Moreover, examples of the quaternary ammonium hydroxide include trimethylhydroxyethylammonium hydroxide (choline), methyltri(hydroxyethyl)ammonium hydroxide, tetra(hydroxyethyl)ammonium hydroxide, and benzyltrimethylammonium hydroxide (BTMAH). In addition thereto, a combination of ammonium hydroxide and one or more quaternary ammonium hydroxides may also be used. Among them, TMAH, TEAH, TPAH, TBAH, and choline are more preferable, and TMAH and TBAH are particularly preferable.

With regard to these organic amines and quaternary ammonium hydroxides, one type thereof may be used on its own or two or more types may be used as a mixture.

The content of the basic organic compound is preferably about 0.01 to about 20.0 wt % relative to the total weight of the cleaning composition of the present invention, and more preferably 1.0 to 10.0 wt %.

(Component d) Organic Acid

The cleaning composition of the present invention comprises at least one organic acid, and the organic acid is preferably a monofunctional, difunctional, trifunctional, or tetrafunctional organic acid. An organic acid is useful as a corrosion inhibitor for a metal.

Among organic acids, a carboxylic acid is preferable since it prevents effectively metal corrosion of aluminum, copper, and an alloy thereof, and a hydroxycarboxylic acid, which has a hydroxy group, is more preferable since it is particularly effective for preventing metal corrosion. Carboxylic acids have the effect of chelating these metals. Preferred examples of the carboxylic acid include a monocarboxylic acid and a polycarboxylic acid. Examples of the carboxylic acid include, but are not limited to, formic acid, acetic acid, propionic acid, valeric acid, isovaleric acid, oxalic acid, malonic acid, succinic acid, glutaric acid, maleic acid, fumaric acid, phthalic acid, 1,2,3-benzenetricarboxylic acid, glycolic acid, lactic acid, citric acid, salicylic acid, tartaric acid, gluconic acid, diglycolic acid, malic acid, acetohydroxamic acid, benzohydroxamic acid, salicylhydroxamic acid, phthalhydroxamic acid, benzoic acid, dihydroxybenzoic acid, and mixtures thereof. Among them, citric acid, malic acid, tartaric acid, glycolic acid, gluconic acid, and lactic acid, which are hydroxycarboxylic acids, may preferably be used.

It is preferable that the carboxylic acid is formed only from C, H, and O as constituent elements, and it is more preferable that it does not have an amino group.

Furthermore, with regard to these organic acids, one type thereof on its own or two or more types as a mixture may be used, but from the viewpoint of preventing effectively metal corrosion, it is preferable to use two or more types thereof in combination.

The organic acid is added preferably at about 0.01 to about 20.0 wt % relative to the total weight of the cleaning composition of the present invention, more preferably about 0.05 to about 20.0 wt %, and yet more preferably 0.1 to 10.0 wt %.

pH

The pH of the cleaning composition of the present invention is preferably 7 to 9, more preferably 7.0 to 8.5, yet more preferably 7.2 to 8.4, and yet more preferably 7.2 to 8.0. When the pH is within the above-mentioned range of numerical values, a balance between prevention of metal corrosion and sufficient removal of photoresist, anti-reflection film, etching residue, and ashing residue can be achieved. By making the pH be in this region, it is possible to completely remove residue when forming a via pattern by plasma etching of silicon oxide and a metal layer.

As a method for measuring pH, measurement can be carried out using a commercial pH meter.

In order to adjust the cleaning composition so as to have a predetermined pH, titration involving adjustment of the amount of organic amine and/or quaternary ammonium hydroxide added can be carried out.

In the present invention, selection of the pH is very important. The pKa of the conjugate acid of a hydroxylamine that is involved in cleaning of residue is about 6, and when the pH of the cleaning composition is less than 7, the cleaning properties are degraded. On the other hand, when the pH is 7 or greater, the cleaning properties improve outstandingly. When only cleaning performance for residue is considered, it is better for the pH to be 7 or greater, and the higher it is, the more the cleaning properties improve. However, when the pH is too high, corrosion occurs, and when the pH exceeds 9, satisfactory anticorrosive performance cannot be achieved. In the present invention, a pH region that achieves a balance between cleaning properties and corrosion prevention has been identified, and it has been found that they are balanced in a range of 7 to 9, preferably 7.0 to 8.5, more preferably 7.2 to 8.4, and yet more preferably 7.2 to 8.0.

The cleaning composition of the present invention may comprise, in addition to the above-mentioned components (component a) to (component d), any one or more components of (component e) to (component h) as listed below.

(Component e) Amino Group-Containing Carboxylic Acid

The cleaning composition of the present invention may comprise an amino group-containing carboxylic acid. An amino group-containing carboxylic acid is preferable in terms of preventing metal corrosion efficiently.

Examples of the amino group-containing carboxylic acid include amino acids such as glycine, alanine, asparagine, aspartic acid, arginine, glutamine, glutamic acid, histidine, serine, cysteine, tyrosine, and phenylalanine, and/or the following group of aminopolycarboxylates {ethylenediaminetetraacetate (EDTA), diethylenetriaminepentaacetate (DTPA), hydroxyethyl ethylenediaminetriacetate (HEDTA), dihydroxyethyl ethylenediaminetetraacetate (DHEDDA), nitrilotriacetate (NTA), hydroxyethyl iminodiacetate (HIDA), β-alaninediacetate, aspartic acid diacetate, methylglycinediacetate, iminodisuccinate, serine diacetate, hydroxyiminodisuccinate, dihydroxyethyl glycinate, aspartate, glutamate, etc.}, the following group of hydroxycarboxylates {hydroxyacetate, tartarate, citrate, gluconate, etc.}, the following group of cyclocarboxylates {pyromellitate, benzopolycarboxylate, cyclopentanetetracarboxylate, etc.}, the following group of ether carboxylates {carboxymethyltartarate, carboxymethyloxysuccinate, oxydisuccinate, tartaric acid monosuccinate, tartaric acid disuccinate, etc.}, the following group of other carboxylates {maleic acid derivative, oxalate, etc.}, the following group of organic carboxylic acid (carboxylate) polymers {acrylic acid polymers and copolymers (acrylic acid/allyl alcohol copolymer, acrylic acid/maleic acid copolymer, hydroxyacrylic acid polymer, polysaccharide/acrylic acid copolymer, etc.)}, the following group of polyvalent carboxylic acid polymers and copolymers {polymers and copolymers of monomers such as maleic acid, itaconic acid, fumaric acid, tetramethylene-1,2-dicarboxylic acid, succinic acid, aspartic acid, and glutamic acid}, the following group of glyoxylic acid polymers and polysaccharides {starch, cellulose, amylose, pectin, carboxymethylcellulose, etc.}, and the following group of phosphonates {methyldiphosphonate, aminotrismethylenephosphonate, ethyl idenediphosphonate, 1-hydroxyethylidene-1,1-diphosphonate, ethylaminobismethylenephosphonate, ethylenediaminebismethylenephosphonate, ethylenediaminetetramethylenephosphonate, hexamethylenediaminetetramethylenephosphonic acid, propylenediaminetetramethylenephosphonate, diethylenetriaminepentamethylenephosphonate, triethylenetetraminehexamethylenephosphonate, tetraethylenepentamineheptamethylenephosphonate, etc.}.

In addition, as salts thereof, an ammonium salt, an alkanolamine (monoethanolamine, triethanolamine, etc.) salt, etc. can be cited. One type thereof or a combination of two or more types may be used.

Among these amino group-containing carboxylic acids, arginine, histidine, glutamine, EDTA, DTPA, and HIDA are preferable, and arginine and histidine are more preferable.

With regard to these amino group-containing carboxylic acids, one type thereof on its own or two or more types as a mixture may be used.

When the cleaning composition of the present invention contains an amino group-containing carboxylic acid, the amount thereof added may be selected as appropriate, but it is preferably about 0.01 to about 5.0 wt % relative to the total weight of the cleaning composition of the present invention, and more preferably 0.01 to 3 wt %.

(Component f) Surfactant

The cleaning composition of the present invention may comprise a surfactant. As the surfactant, nonionic, anionic, cationic, and amphoteric surfactants may be used.

With regard to the surfactant used in the present invention, in terms of adjusting the viscosity of the cleaning composition and improving the wettability toward the cleaning target due to its addition and in terms of corrosion prevention of an insulating film, etc. being excellent, a nonionic surfactant may preferably be used. Examples of the nonionic surfactant include a polyalkylene oxide alkyl phenyl ether-based surfactant, a polyalkylene oxide alkyl ether-based surfactant, a polyethylene oxide/polypropylene oxide block copolymer-based surfactant, a polyoxyalkylene distyrenated phenyl ether-based surfactant, a polyalkylene tribenzyl phenyl ether-based surfactant, and an acetylene polyalkylene oxide-based surfactant.

Among them, a polyalkylene oxide alkyl ether-based surfactant is preferable, the polyalkylene oxide (hereinafter called PAO) alkyl ether-based surfactant being selected from a PAO decyl ether, a PAO lauryl ether, a PAO tridecyl ether, a PAO alkylene decyl ether, a PAO sorbitan monolaurate, a PAO sorbitan monooleate, a PAO sorbitan monostearate, tetraoleic acid polyethylene oxide sorbitol, a PAO alkylamine, and a PAO acetylene glycol. As the polyalkylene oxide, a polymer of polyethylene oxide, polypropylene oxide, or polybutylene oxide is preferable.

Furthermore, as the surfactant used in the present invention, in terms of both removability of residue and corrosion prevention of a substrate, an insulating film, etc. being excellent, a cationic surfactant may also be used preferably. As the cationic surfactant, a quaternary ammonium salt-based surfactant or an alkylpyridinium-based surfactant is preferable.

As the quaternary ammonium salt-based surfactant, a compound represented by Formula (1) below is preferable.

(1)

wherein X⁻ denotes hydroxide ion, chloride ion, bromide ion, or nitrate ion, $R_5$ denotes an alkyl group having 8 to 18 carbon atoms, $R_6$ and $R_7$ independently denote an alkyl group having 1 to 18 carbon atoms, an aryl group, a hydroxyalkyl group having 1 to 8 carbon atoms, or a benzyl group, and $R_8$ denotes an alkyl group having 1 to 3 carbon atoms.

In Formula (1), X⁻ denotes a counter anion, and specifically denotes hydroxide ion, chloride ion, bromide ion, or nitrate ion.

In Formula (1), $R_5$ is an alkyl group having 8 to 18 carbon atoms (preferably 12 to 18 carbon atoms, examples thereof including a cetyl group and a stearyl group).

In Formula (1), $R_6$ and $R_7$ independently denote an alkyl group having 1 to 18 carbon atoms, a hydroxyalkyl group having 1 to 8 carbon atoms (e.g. hydroxyethyl, etc.), an aryl group (e.g. a phenyl group etc.), or a benzyl group.

In Formula (1), $R_8$ denotes an alkyl group having 1 to 3 carbon atoms (e.g. a methyl group, an ethyl group, etc.).

Specific examples of the compound represented by Formula (1) include cetyltrimethylammonium chloride, didodecyldimethylammonium chloride, tridecylmethylammonium chloride, and stearylbenzyldimethylammonium chloride. The counter anion of these compounds is not limited to chloride ion, and it may be bromide ion or hydroxide ion.

Furthermore, specific examples of the alkylpyridinium-based surfactant include cetylpyridinium chloride. The counter anion of these compounds is not limited to chloride ion, and it may be bromide ion or hydroxide ion.

The content of the surfactant in the cleaning composition is preferably 0.0001 to 5 wt % relative to the total weight of the cleaning composition, and more preferably 0.0001 to 1 wt %. It is preferable to add a surfactant to the cleaning composition since the viscosity of the cleaning composition can be adjusted and wettability toward the cleaning target can be improved and, in addition, it is preferable in terms of corrosion resistance of a substrate, an insulating film, etc. being better. Such a surfactant is generally available commercially. These surfactants may be used singly or in a combination of a plurality thereof.

(Component g) Water-Soluble Organic Solvent

The cleaning composition of the present invention may comprise a water-soluble organic solvent. A water-soluble organic solvent is desirable in terms of corrosion prevention. Examples thereof include alcohol-based solvents such as methyl alcohol, ethyl alcohol, 1-propyl alcohol, 2-propyl alcohol, 2-butanol, ethylene glycol, propylene glycol, glycerol, 1,6-hexanediol, cyclohexanediol, sorbitol, xylitol, 2-methyl-2,4-pentanediol, 1,3-butanediol, and 1,4-butanediol, ether-based solvents such as ethylene glycol monomethyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monomethyl ether, diethylene glycol monobutyl ether, and diethylene glycol monobutyl ether, amide-based solvents such as formamide, monomethylformamide, dimethylformamide, acetamide, monomethylacetamide, dimethylacetamide, monoethylacetamide, diethylacetamide, and N-methylpyrrolidone, sulfur-containing solvents such as dimethyl sulfone, dimethyl sulfoxide, and sulfolane, and lactone-based solvents such as γ-butyrolactone and δ-valerolactone. Among them, alcohol-based and ether-based solvents are preferable, and 1,6-hexanediol, diethylene glycol, propylene glycol, dipropylene glycol, propylene glycol monomethyl ether, and dipropylene glycol monomethyl ether are preferable. The water-soluble organic solvents may be used singly or in an appropriate combination of two or more types.

The content of the water-soluble organic solvent in the cleaning composition is preferably 0 to 40 wt % relative to the total weight of the cleaning composition, more preferably 0 to 20 wt %, and yet more preferably 0.01 to 15 wt %. It is preferable to add a water-soluble organic solvent to the cleaning composition since corrosion of a metal film can be prevented.

(Component h) Corrosion Inhibitor

The cleaning composition of the present invention may comprise a corrosion inhibitor.

The corrosion inhibitor is preferably a heterocyclic compound, and more preferably benzotriazole or a derivative thereof. Preferred examples of the derivative include 5,6- dimethyl-1,2,3-benzotriazole (DBTA), 1-(1,2-dicarboxyethyl)benzotriazole (DCEBTA), 1-[N,N-bis(hydroxyethyl)aminomethyl]benzotriazole (HEABTA), and 1-(hydroxymethyl)benzotriazole (HMBTA).

The corrosion inhibitor used in the present invention may be used singly or in a combination of two or more types. Furthermore, the corrosion inhibitor used in the present invention may be synthesized by a standard method or a commercial product may be used.

The amount of corrosion inhibitor added is preferably at least 0.01 wt % but no greater than 0.2 wt %, and more preferably at least 0.05 wt % but no greater than 0.2 wt %.

(Cleaning Process)

The cleaning process of the present invention is now explained.

The cleaning process of the present invention comprises a preparation step of preparing the cleaning composition of the present invention described above, and a cleaning step of cleaning, by means of the cleaning composition, plasma etching residue and/or ashing residue formed above a semiconductor substrate.

The above-mentioned preparation step is a step of preparing the cleaning composition of the present invention. The cleaning composition of the present invention is prepared by mixing component a to component d, which are essential components as described above, and as necessary component e to component h, which are optional components.

The pH of the cleaning composition of the present invention is adjusted so as to be in the range of 7 to 9, preferably in the range of 7.0 to 8.5, more preferably in the range of 7.2 to 8.4, and yet more preferably in the range of 7.2 to 8.0. Adjustment of pH is preferably carried out by adjusting the amount added of the basic organic compound, which is component c.

The above-mentioned cleaning step is a step of cleaning, by means of the cleaning composition of the present invention, plasma etching residue and/or ashing residue formed above a semiconductor substrate.

Plasma etching residue that is to be cleaned and removed in the cleaning step is formed above a semiconductor substrate by plasma etching during an etching step of carrying out plasma etching.

In the etching step, a resist pattern is sometimes used as a mask for plasma etching. In this case, it is preferable to carry out an ashing step of removing the resist pattern by ashing employing, for example, plasma or oxygen after the etching step but prior to the cleaning step. Ashing residue that is cleaned and removed in the cleaning step is formed above a semiconductor substrate by ashing during the ashing step.

The semiconductor substrate preferably has a metal layer such as, for example, a via or wiring formed thereabove, and more preferably comprises aluminum and/or copper.

Configuration of cleaning in the cleaning step is not particularly limited as long as the surface of the semiconductor substrate above which at least plasma etching residue and/or ashing residue are formed is contacted with the cleaning composition of the present invention, but a configuration in which the semiconductor substrate is immersed in the cleaning composition of the present invention is preferable.

(Process for Producing Semiconductor Device)

The process for producing a semiconductor device of the present invention is now explained in detail.

The process for producing a semiconductor device of the present invention comprises an etching step of subjecting a semiconductor substrate to plasma etching and/or an ashing step of subjecting a resist above the semiconductor substrate to ashing, and a cleaning step of cleaning, by means of the cleaning composition of the present invention, plasma etching residue and/or ashing residue formed above the semiconductor substrate in the etching step and/or the ashing step. Specifically, the process for producing a semiconductor device of the present invention preferably employs the cleaning composition of the present invention in cleaning of a semiconductor substrate after forming a via hole or wiring.

The 'semiconductor substrate' referred to in the present invention means a substrate used for a semiconductor device and, unless otherwise specified, may be not only a semiconductor substrate in the strict sense such as a silicon wafer but also a substrate having, for example, an interlayer insulating film, a tungsten plug, a via hole, wiring, etc. formed above a silicon wafer.

Several embodiments are illustrated below.

First Embodiment

Figure 1A:
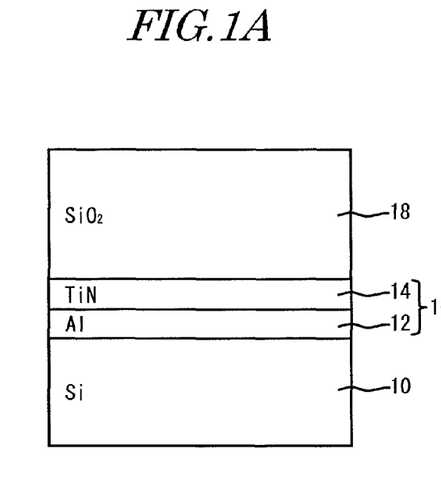
FIGS. 1A to 1D Cross-sectional views schematically showing steps of the process for producing a semiconductor device of the present invention.
Figure 1B:
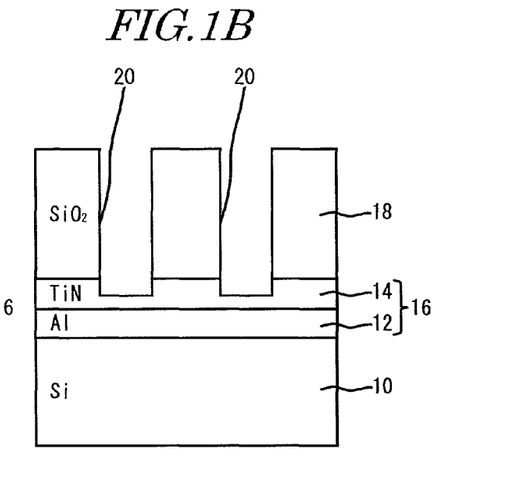

FIGS. 1A and 1B are cross-sectional views schematically showing steps of the process for producing a semiconductor device based on a first embodiment of the present invention.

First, a transistor or another device or one or more layers of wiring are formed above a semiconductor substrate 10 such as a silicon wafer by a standard process for producing a semiconductor device. Subsequently, an interlayer insulating film is formed above the semiconductor substrate 10 having a device, etc. formed thereabove.

Next, the entire face is subjected to sequentially layering by, for example, a CVD (Chemical Vapor Deposition) method an Al alloy film 12 having a film thickness of, for example, about 500 nm and a titanium nitride film 14 having a film thickness of, for example, about 50 nm. In this way, a conductor film having the Al alloy film 12 and the titanium nitride film 14 sequentially layered is formed. The Al alloy film 12 is an Al—Cu alloy film containing, for example, 0.1% to 5% Cu.

Next, the conductor film is subjected to patterning by photolithography and dry etching. In this way, wiring 16 formed from the Al alloy film 12 and the titanium nitride film 14 is formed.

Next, a silicon oxide film 18 having a film thickness of, for example, about 500 nm is formed on the entire face by, for example, a CVD method.

Next, the surface of the silicon oxide film 18 is polished by, for example, a CMP (Chemical Mechanical Polishing) method, thus planarizing the surface of the silicon oxide film 18 (see FIG. 1A).

Next, a photoresist film having a via pattern is formed above the silicon oxide film 18 by photolithography. Subsequently, the silicon oxide film 18 is etched by plasma etching using this photoresist film as a mask. In this process, an upper part of the titanium nitride film 14 below the silicon oxide film 18 is also etched. In this way, a via hole (via pattern A) 20 reaching the titanium nitride film 14 of the wiring 16 is formed in the silicon oxide film 18 (see FIG. 1B). Plasma etching of the silicon oxide film 18 and the upper part of the titanium nitride film 14 may each be carried out by known methods.

Next, the photoresist film used as a mask is removed by ashing employing, for example, plasma or oxygen. Ashing of the photoresist film may be carried out using a known method.

In plasma etching for forming the via hole 20 and ashing for removing the photoresist film, residue (plasma etching residue and ashing residue) derived from the degenerated photoresist film, silicon oxide film 18, and titanium nitride film 14 exposed on the bottom of the via hole 20 becomes attached to the substrate surface, including the surface around the via hole 20.

After ashing for removing the photoresist film, the semiconductor substrate 10 having the via hole 20 already formed thereabove is subjected to cleaning by means of the cleaning composition of the present invention. In this way, plasma etching residue and ashing residue attached to the surface of the semiconductor substrate 10 having the via hole 20 already formed are removed.

Next, a tungsten film is formed on the entire face by, for example, a CVD method.

Next, the tungsten film is polished by, for example, a CMP method until the surface of the silicon oxide film 18 is exposed. In this way, a via formed from tungsten is embedded within the via hole 20.

Second Embodiment

Figure 1C:
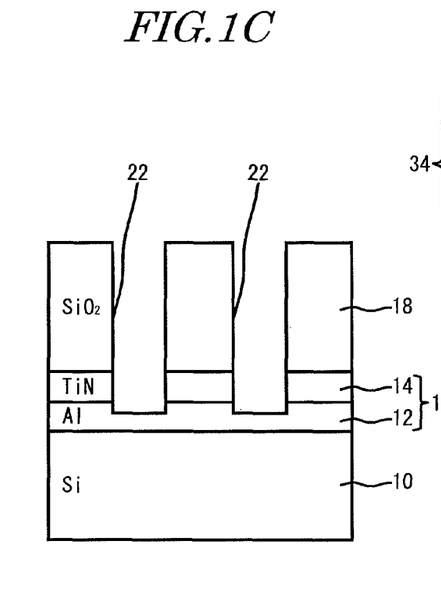

A process for producing a semiconductor device in accordance with a second embodiment of the present invention is now explained briefly by reference also to FIGS. 1A and 1C. The process for producing a semiconductor device in accordance with the present embodiment is different from the process for producing a semiconductor device in accordance with the first embodiment in terms of forming a via hole 22 that reaches an Al alloy film 12 of wiring 16.

First, the wiring 16 formed from the Al alloy film 12 and a titanium nitride film 14 and a silicon oxide film 18 are formed above a semiconductor substrate 10 in the same manner as in the process for producing a semiconductor device in accordance with the first embodiment (see FIG. 1A).

Next, a photoresist film having a via pattern is formed above the silicon oxide film 18 by photolithography. Subsequently, the silicon oxide film 18 and the titanium nitride film 14 are etched by plasma etching using this photoresist film as a mask. In this process, an upper part of the Al alloy film 12 beneath the titanium nitride film 14 is also etched. In this way, the via hole 22 (via pattern B) that reaches the Al alloy film 12 of the wiring 16 is formed in the silicon oxide film 18 and the titanium nitride film 14 (see FIG. 1C). Plasma etching of the silicon oxide film 18, the titanium nitride film 14, and the upper part of the Al alloy film 12 may each be carried out by known methods.

Next, the photoresist film used as a mask is removed by ashing employing, for example, plasma or oxygen. Ashing of the photoresist film may be carried out using a known method.

In the case of the present embodiment, during plasma etching for forming the via hole 22 and ashing for removing the photoresist film, plasma etching residue and ashing residue become attached to the substrate surface including the surface around the via hole 22 and a wall face of the via hole 22. In the case of the present embodiment, plasma etching residue and ashing residue are derived not only from the degenerated photoresist film, silicon oxide film 18, and titanium nitride film 14 but also from the Al alloy film 12 exposed in the bottom of the via hole 22.

After ashing for removing the photoresist film, the semiconductor substrate 10 having the via hole 22 already formed thereabove is subjected to cleaning by means of the cleaning composition of the present invention. In this way, plasma etching residue and ashing residue attached to the surface of the semiconductor substrate 10 having the via hole 22 already formed are removed.

Next, a via embedded in the via hole 22 is formed in the same manner as in the process for producing a semiconductor device in accordance with the first embodiment.

Third Embodiment

Figure 1D:
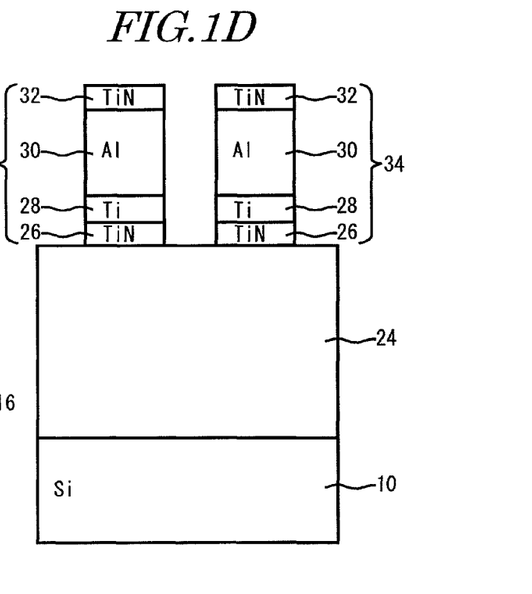
Figure 2:
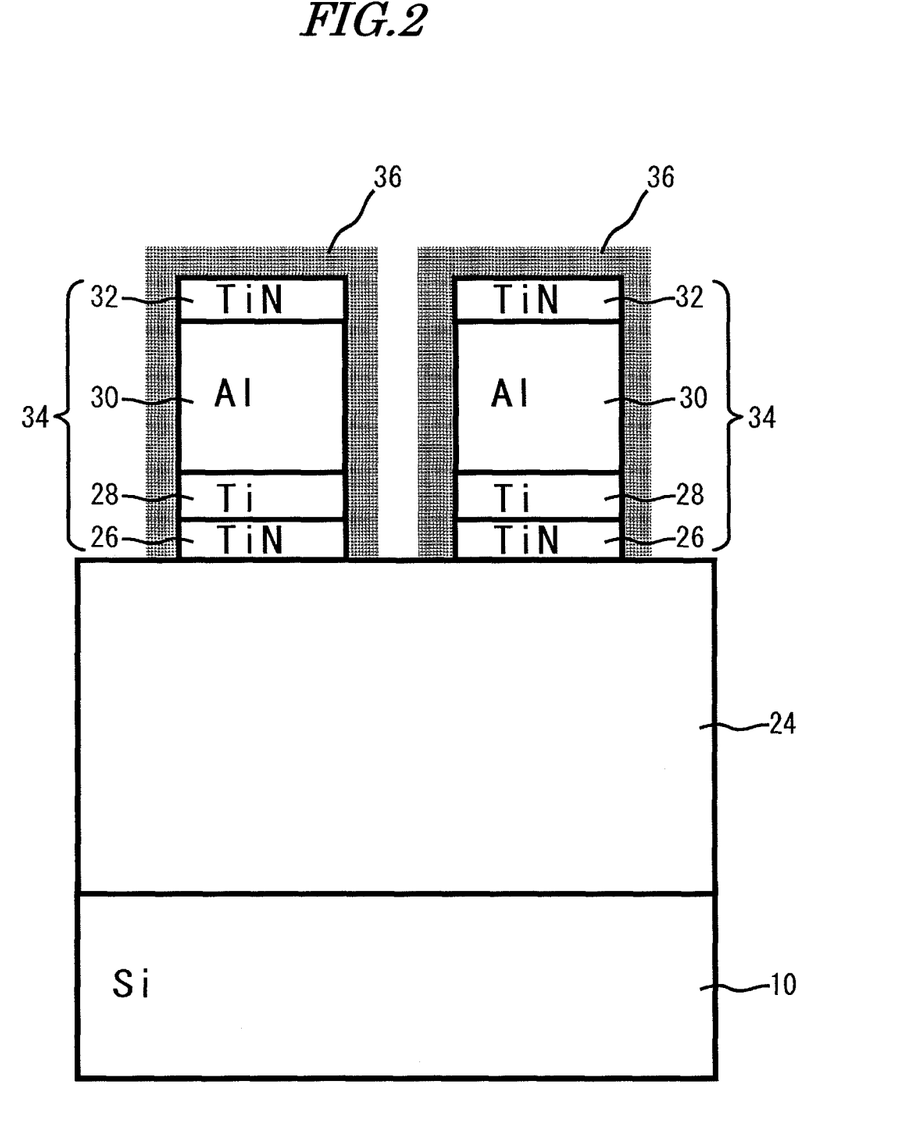
FIG. 2 A cross-sectional view schematically showing a semiconductor device in a state in which plasma etching residue and ashing residue is attached after ashing.

A process for producing a semiconductor device in accordance with a third embodiment of the present invention is now explained briefly by reference to FIGS. 1D and 2.

First, an interlayer insulating film 24 is formed above a semiconductor substrate 10 having a device, etc. formed thereabove in the same manner as in the process for producing a semiconductor device in accordance with the first embodiment.

Next, sequentially layered by, for example, a CVD method on the entire face thereof are a titanium nitride film 26 having a film thickness of, for example, about 50 nm, a titanium film 28 having a film thickness of, for example, about 20 nm, an Al alloy film 30 having a film thickness of, for example, about 500 nm, and a titanium nitride film 32 having a film thickness of, for example, about 50 nm. The Al alloy film 30 is, for example, an Al/Cu alloy film containing 0.1% to 5% Cu.

Next, a photoresist film having a wiring pattern is formed above the titanium nitride film 32 by photolithography. Subsequently, the titanium nitride film 32, the Al alloy film 30, the titanium film 28, and the titanium nitride film 26 are sequentially etched by plasma etching using this photoresist film as a mask. In this way, the titanium nitride film 32, the Al alloy film 30, the titanium film 28, and the titanium nitride film 26 are subjected to patterning, and wiring (wiring pattern) 34 comprising these conductor films is formed.

Next, the majority of the photoresist film used as a mask is stripped off by a wet treatment using a liquid reagent. Subsequently, the remaining part of the photoresist film is removed by ashing using, for example, plasma or oxygen (see FIG. 1D).

In plasma etching for forming the wiring 34 and ashing for removing the remaining part of the photoresist film, as shown in FIG. 2, residue (plasma etching residue and ashing residue) 36 becomes attached to the substrate surface, including an upper face and a side face of the wiring 34. This residue 36 is derived from the degenerated photoresist film, titanium nitride film 32, Al alloy film 30, titanium film 28, and titanium nitride film 26.

After ashing for removing the residual part of the photoresist film, the semiconductor substrate 10 having the wiring 34 already formed thereabove is subjected to cleaning by means of the cleaning composition of the present invention. In this way, plasma etching residue and ashing residue attached to the surface of the semiconductor substrate 10 having the wiring 34 already formed are removed.

In the above-mentioned embodiments, cases in which the wiring 16, 34 comprising the Al alloy film 12, 30 is formed are explained, but the material for wiring is not limited to those described above. With regard to the wiring, in addition to wiring employing as a main material Al formed from Al or an Al alloy, wiring employing as a main material Cu formed from Cu or a Cu alloy may be formed.

Furthermore, the cleaning composition of the present invention may be widely used in a step of cleaning plasma etching residue and/or ashing residue from a semiconductor substrate containing aluminum and/or copper, and aluminum or copper is preferably contained in a wiring structure formed above a semiconductor substrate.

In accordance with the present invention, there can be provided a cleaning composition that can sufficiently remove plasma etching residue or ashing residue above a semiconductor substrate without damaging a wiring structure or an interlayer insulating structure, and a cleaning process and a process for producing a semiconductor device that employ the cleaning composition.

EXAMPLES

The present invention is explained in further detail below by reference to Examples. However, the present invention is not limited by these Examples.

Examination of Residue by Scanning Electron Microscope

With regard to the first and second embodiments above, after forming the via hole and before cleaning using the cleaning composition of the present invention, the patterned wafers were examined using a scanning electron microscope (SEM), and plasma etching residue and ashing residue were observed on the via hole wall face in both cases. Furthermore, with regard to the third embodiment above, after forming the wiring and before cleaning using the cleaning composition of the present invention, the patterned wafer was examined using SEM, and plasma etching residue and ashing residue were observed on the upper face and side face of the wiring.

Examples 1 to 62 and Comparative Examples 1 to 7

Next, cleaning compositions 1 to 69 having the compositions shown in Tables 1 to 3 (Examples 1 to 62 and Comparative Examples 1 to 7) were prepared. A piece (about 2 cm×2 cm) of the above-mentioned patterned wafer was immersed in each cleaning composition regulated at the temperature described in Tables 1 to 3, the piece of patterned wafer was taken out after the immersion time described in Tables 1 to 3, immediately washed with ultrapure water, and then dried with $N_2$. A cross-section and the surface of the piece of patterned wafer after the immersion test were examined using SEM, and evaluated in terms of removability of photoresist and residue (plasma etching residue and ashing residue) and corrosion resistance of Al and TiN in accordance with evaluation criteria described below. The results of evaluation of removability and corrosion resistance are summarized in Table 4 and Table 5 below.

The evaluation criteria are shown below.

First Embodiment

Via Pattern A

Removal of Residue on Surface Around Via Hole
Excellent: photoresist and residue were completely removed.
Good: photoresist and residue were almost completely removed.
Fair: incompletely dissolved photoresist and residue material remained.
Poor: photoresist and residue were hardly removed.
TiN Corrosion in Bottom of Via Hole
Excellent: corrosion of TiN was not observed.
Good: corrosion of TiN was observed at not more than 5% for wiring.
Fair: corrosion of TiN was observed at not more than 10% for wiring.
Poor: TiN was completely lost.

Second Embodiment

Via Pattern B

Removal of Residue on Surface Around Via Hole
Excellent: photoresist and residue were completely removed.
Good: photoresist and residue were almost completely removed.
Fair: incompletely dissolved photoresist and residue material remained.
Poor: photoresist and residue were hardly removed.
Al Corrosion in Bottom of Via Hole
Excellent: corrosion of Al was not observed.
Good: corrosion of Al was observed at not more than 5% for wiring.
Fair: corrosion of Al was observed at not more than 10% for wiring.
Poor: Al wiring was completely lost.

Third Embodiment

Wiring Pattern

Removal of Residue on Wiring Side Face and Upper Face
Excellent: photoresist and residue were completely removed.
Good: photoresist and residue were almost completely removed.
Fair: incompletely dissolved photoresist and residue material remained.
Poor: photoresist and residue were hardly removed.
Al Corrosion (Recess)
Excellent: recess in Al was not observed.
Good: recess in Al was observed at not more than 5% for wiring.
Fair: recess in Al was observed at not more than 10% for wiring.
Poor: Al wiring was completely lost.

In the above-mentioned evaluation, it is desirable that the evaluation of removability and corrosion resistance is 'Excellent" in all cases. Furthermore, it is more desirable that the evaluation becomes 'Excellent' with a short time and a low temperature.

TABLE 1

|  | (Component a) Water | (Component b) Hydroxylamine and/or salt thereof | (Component c) Basic organic compound | (Component d) Organic acid | |
|---|---|---|---|---|---|
| Example 1 | Remainder | Hydroxylamine sulfate 20.5% | TMAH (pH adjustment) | Lactic acid 3.0% | — |
| Example 2 | Remainder | Hydroxylamine sulfate 4.0% | TMAH (pH adjustment) | Citric acid 1.0% | — |
| Example 3 | Remainder | Hydroxylamine sulfate 4.0% | TMAH (pH adjustment) | Citric acid 1.0% | — |
| Example 4 | Remainder | Hydroxylamine sulfate 4.0% | TMAH (pH adjustment) | Citric acid 1.0% | — |
| Example 5 | Remainder | Hydroxylamine sulfate 4.0% | TMAH (pH adjustment) | Lactic acid 1.0% | — |
| Example 6 | Remainder | Hydroxylamine sulfate 4.0% | TMAH (pH adjustment) | Acetic acid 1.0% | — |
| Example 7 | Remainder | Hydroxylamine sulfate 4.0% | TMAH (pH adjustment) | Propionic acid 1.0% | — |
| Example 8 | Remainder | Hydroxylamine sulfate 4.0% | TMAH (pH adjustment) | Malic acid 1.0% | — |
| Example 9 | Remainder | Hydroxylamine sulfate 4.0% | TMAH (pH adjustment) | Tartaric acid 1.0% | — |
| Example 10 | Remainder | Hydroxylamine sulfate 4.0% | TMAH (pH adjustment) | Malonic acid 1.0% | — |
| Example 11 | Remainder | Hydroxylamine sulfate 4.0% | TMAH (pH adjustment) | Oxalic acid 1.0% | — |
| Example 12 | Remainder | Hydroxylamine sulfate 4.0% | TMAH (pH adjustment) | Succinic acid 1.0% | — |
| Example 13 | Remainder | Hydroxylamine sulfate 4.0% | TMAH (pH adjustment) | Gluconic acid 1.0% | — |
| Example 14 | Remainder | Hydroxylamine sulfate 4.0% | TMAH (pH adjustment) | Glycolic acid 1.0% | — |
| Example 15 | Remainder | Hydroxylamine sulfate 4.0% | TMAH (pH adjustment) | Diglycolic acid 1.0% | — |
| Example 16 | Remainder | Hydroxylamine sulfate 4.0% | TMAH (pH adjustment) | Maleic acid 1.0% | — |

TABLE 1-continued

| | | | | | |
|---|---|---|---|---|---|
| Example 17 | Remainder | Hydroxylamine sulfate 4.0% | TMAH (pH adjustment) | Benzoic acid 1.0% | — |
| Example 18 | Remainder | Hydroxylamine sulfate 4.0% | TMAH (pH adjustment) | Phthalic acid 1.0% | — |
| Example 19 | Remainder | Hydroxylamine sulfate 4.0% | TMAH (pH adjustment) | Salicylic acid 1.0% | — |
| Example 20 | Remainder | Hydroxylamine sulfate 4.0% | TMAH (pH adjustment) | Salicylhydroxamic acid 1.0% | — |
| Example 21 | Remainder | Hydroxylamine sulfate 4.0% | TMAH (pH adjustment) | Phthalhydroxamic acid 1.0% | — |
| Example 22 | Remainder | Hydroxylamine sulfate 4.0% | TMAH (pH adjustment) | Citric acid 1.0% | — |
| Example 23 | Remainder | Hydroxylamine sulfate 4.0% | TMAH (pH adjustment) | Citric acid 1.0% | — |

| | (Component e) Amino group-containing carboxylic acid | (Component g) Water-soluble organic solvent | pH | Temp. [° C.] | Immersion time [min] |
|---|---|---|---|---|---|
| Example 1 | — | — | 7.0 | 70 | 30 |
| Example 2 | — | — | 7.0 | 70 | 30 |
| Example 3 | — | — | 7.2 | 70 | 30 |
| Example 4 | — | — | 7.4 | 70 | 30 |
| Example 5 | — | — | 7.4 | 70 | 10 |
| Example 6 | — | — | 7.4 | 70 | 10 |
| Example 7 | — | — | 7.4 | 70 | 10 |
| Example 8 | — | — | 7.4 | 70 | 30 |
| Example 9 | — | — | 7.4 | 70 | 30 |
| Example 10 | — | — | 7.4 | 70 | 10 |
| Example 11 | — | — | 7.4 | 70 | 10 |
| Example 12 | — | — | 7.4 | 70 | 10 |
| Example 13 | — | — | 7.4 | 70 | 30 |
| Example 14 | — | — | 7.4 | 70 | 20 |
| Example 15 | — | — | 7.4 | 70 | 20 |
| Example 16 | — | — | 7.4 | 70 | 20 |
| Example 17 | — | — | 7.4 | 70 | 10 |
| Example 18 | — | — | 7.4 | 70 | 10 |
| Example 19 | — | — | 7.4 | 70 | 10 |
| Example 20 | — | — | 7.4 | 70 | 40 |
| Example 21 | — | — | 7.4 | 70 | 40 |
| Example 22 | — | Cyclohexanediol 5% | 7.4 | 70 | 30 |
| Example 23 | — | 2-Methyl-2,4-pentanediol 15% | 7.4 | 70 | 30 |

TABLE 2

| | (Component a) Water | (Component b) Hydroxylamine and/or salt thereof | (Component c) Basic organic compound | (Component d) Organic acid | |
|---|---|---|---|---|---|
| Example 24 | Remainder | Hydroxylamine sulfate 4.0% | TMAH (pH adjustment) | Citric acid 1.0% | — |
| Example 25 | Remainder | Hydroxylamine sulfate 4.0% | TMAH (pH adjustment) | Citric acid 1.0% | — |
| Example 26 | Remainder | Hydroxylamine sulfate 4.0% | TMAH (pH adjustment) | Citric acid 1.0% | — |
| Example 27 | Remainder | Hydroxylamine sulfate 4.0% | TMAH (pH adjustment) | Citric acid 1.0% | — |
| Example 28 | Remainder | Hydroxylamine sulfate 4.0% | TMAH (pH adjustment) | Citric acid 1.0% | Glycolic acid 3.0% |
| Example 29 | Remainder | Hydroxylamine sulfate 4.0% | TMAH (pH adjustment) | Citric acid 1.0% | Lactic acid 3.0% |
| Example 30 | Remainder | Hydroxylamine sulfate 4.0% | TMAH (pH adjustment) | Citric acid 1.0% | Salicylhydroxamic acid 1.0% |
| Example 31 | Remainder | Hydroxylamine 1.3% | TMAH (pH adjustment) | Citric acid 1.0% | — |
| Example 32 | Remainder | Hydroxylamine hydrochloride 3.0% | TMAH (pH adjustment) | Citric acid 1.0% | — |
| Example 33 | Remainder | Hydroxylamine phosphate 4.0% | TMAH (pH adjustment) | Citric acid 1.0% | — |
| Example 34 | Remainder | Hydroxylamine nitrate 3.0% | TMAH (pH adjustment) | Citric acid 1.0% | — |
| Example 35 | Remainder | Hydroxylamine sulfate 4.0% | TEAH (pH adjustment) | Citric acid 1.0% | — |
| Example 36 | Remainder | Hydroxylamine sulfate 4.0% | TPAH (pH adjustment) | Citric acid 1.0% | — |
| Example 37 | Remainder | Hydroxylamine sulfate 4.0% | TBAH (pH adjustment) | Citric acid 1.0% | — |
| Example 38 | Remainder | Hydroxylamine sulfate 4.0% | BTMAH (pH adjustment) | Citric acid 1.0% | — |
| Example 39 | Remainder | Hydroxylamine sulfate 4.0% | Choline (pH adjustment) | Citric acid 1.0% | — |
| Example 40 | Remainder | Hydroxylamine sulfate 4.0% | EDA (pH adjustment) | Citric acid 1.0% | — |
| Example 41 | Remainder | Hydroxylamine sulfate 4.0% | n-Butylamine (pH adjustment) | Citric acid 1.0% | — |
| Example 42 | Remainder | Hydroxylamine sulfate 4.0% | tert-Butylamine (pH adjustment) | Citric acid 1.0% | — |
| Example 43 | Remainder | Hydroxylamine sulfate 4.0% | n-Hexylamine (pH adjustment) | Citric acid 1.0% | — |
| Example 44 | Remainder | Hydroxylamine sulfate 4.0% | 2-Ethylhexylamine (pH adjustment) | Citric acid 1.0% | — |
| Example 45 | Remainder | Hydroxylamine sulfate 4.0% | Cyclohexylamine (pH adjustment) | Citric acid 1.0% | — |

TABLE 2-continued

| | | | | | | |
|---|---|---|---|---|---|---|
| Example 46 | Remainder | Hydroxylamine sulfate 4.0% | Benzylamine (pH adjustment) | | Citric acid 1.0% | — |

| | (Component e) Amino group-containing carboxylic acid | (Component g) Water-soluble organic solvent | pH | Temp. [° C.] | Immersion time [min] |
|---|---|---|---|---|---|
| Example 24 | — | 1,3-Butanediol 10% | 7.4 | 70 | 30 |
| Example 25 | — | 2-Butanol 8% | 7.4 | 70 | 30 |
| Example 26 | — | Dipropylene glycol 12% | 7.4 | 70 | 30 |
| Example 27 | — | Glycerol 5% | 7.4 | 70 | 30 |
| Example 28 | — | — | 7.4 | 70 | 30 |
| Example 29 | — | — | 7.4 | 70 | 30 |
| Example 30 | — | — | 7.4 | 70 | 30 |
| Example 31 | — | — | 7.4 | 70 | 30 |
| Example 32 | — | — | 7.4 | 70 | 30 |
| Example 33 | — | — | 7.4 | 70 | 30 |
| Example 34 | — | — | 7.4 | 70 | 30 |
| Example 35 | — | — | 7.4 | 70 | 30 |
| Example 36 | — | — | 7.4 | 70 | 30 |
| Example 37 | — | — | 7.4 | 70 | 30 |
| Example 38 | — | — | 7.4 | 70 | 30 |
| Example 39 | — | — | 7.4 | 70 | 30 |
| Example 40 | — | — | 7.4 | 70 | 30 |
| Example 41 | — | — | 7.4 | 70 | 30 |
| Example 42 | — | — | 7.4 | 70 | 30 |
| Example 43 | — | — | 7.4 | 70 | 30 |
| Example 44 | — | — | 7.4 | 70 | 30 |
| Example 45 | — | — | 7.4 | 70 | 30 |
| Example 46 | — | — | 7.4 | 70 | 30 |

TABLE 3

| | (Component a) Water | (Component b) Hydroxylamine and/or salt thereof | (Component c) Basic organic compound | (Component d) Organic acid | |
|---|---|---|---|---|---|
| Example 47 | Remainder | Hydroxylamine sulfate 4.0% | 2-Amino benzylamine (pH adjustment) | Citric acid 1.0% | — |
| Example 48 | Remainder | Hydroxylamine sulfate 4.0% | m-Xylylenediamine (pH adjustment) | Citric acid 1.0% | — |
| Example 49 | Remainder | Hydroxylamine sulfate 4.0% | N-Benzyl ethylenediamine (pH adjustment) | Citric acid 1.0% | — |
| Example 50 | Remainder | Hydroxylamine sulfate 4.0% | TMAH + n-hexylamine (pH adjustment) | Citric acid 1.0% | — |
| Example 51 | Remainder | Hydroxylamine sulfate 4.0% | TMAH (pH adjustment) | Citric acid 1.0% | — |
| Example 52 | Remainder | Hydroxylamine sulfate 5.0% | TMAH (pH adjustment) | Citric acid 2.0% | — |
| Example 53 | Remainder | Hydroxylamine sulfate 5.0% | TMAH (pH adjustment) | Citric acid 2.0% | Glycolic acid 6.0% |
| Example 54 | Remainder | Hydroxylamine sulfate 4.0% | TMAH + cyclohexylamine (pH adjustment) | Citric acid 2.0% | — |
| Example 55 | Remainder | Hydroxylamine sulfate 4.0% | TMAH + cyclohexylamine (pH adjustment) | Citric acid 2.0% | — |
| Example 56 | Remainder | Hydroxylamine sulfate 4.0% | TMAH (pH adjustment) | Citric acid 1.0% | — |
| Example 57 | Remainder | Hydroxylamine sulfate 4.0% | TMAH (pH adjustment) | Citric acid 1.0% | — |
| Example 58 | Remainder | Hydroxylamine sulfate 4.0% | TMAH (pH adjustment) | Citric acid 1.0% | — |
| Example 59 | Remainder | Hydroxylamine sulfate 4.0% | TMAH (pH adjustment) | Citric acid 1.0% | — |
| Example 60 | Remainder | Hydroxylamine sulfate 4.0% | TMAH (pH adjustment) | Citric acid 1.0% | — |
| Example 61 | Remainder | Hydroxylamine sulfate 4.0% | TMAH (pH adjustment) | Citric acid 1.0% | — |
| Example 62 | Remainder | Hydroxylamine sulfate 4.0% | TMAH (pH adjustment) | Citric acid 1.0% | — |
| Comparative Example 1 | Remainder | Hydroxylamine sulfate 20.5% | TMAH 0.23% | Lactic acid 3.0% | — |
| Comparative Example 2 | Remainder | Hydroxylamine sulfate 20.5% | TMAH (pH adjustment) | Lactic acid 3.0% | — |
| Comparative Example 3 | Remainder | Hydroxylamine sulfate 4.0% | TMAH (pH adjustment) | Lactic acid 3.0% | — |
| Comparative Example 4 | Remainder | Hydroxylamine sulfate 4.0% | TMAH (pH adjustment) | — | — |
| Comparative Example 5 | Remainder | — | TMAH (pH adjustment) | Citric acid 1.0% | — |
| Comparative Example 6 | Remainder | Hydroxylamine sulfate 4.0% | TMAH (pH adjustment) | Citric acid 1.0% | — |
| Comparative Example 7 | Remainder | Hydroxylamine sulfate 4.0% | TMAH (pH adjustment) | Citric acid 1.0% | — |

TABLE 3-continued

|  | (Component e) Amino group-containing carboxylic acid | (Component g) Water-soluble organic solvent | pH | Temp. [° C.] | Immersion time [min] |
|---|---|---|---|---|---|
| Example 47 | — | — | 7.4 | 70 | 30 |
| Example 48 | — | — | 7.4 | 70 | 30 |
| Example 49 | — | — | 7.4 | 70 | 30 |
| Example 50 | — | — | 7.4 | 70 | 30 |
| Example 51 | — | — | 7.6 | 70 | 30 |
| Example 52 | — | — | 7.6 | 70 | 30 |
| Example 53 | — | — | 7.6 | 70 | 30 |
| Example 54 | — | 1,3-Butanediol 10% | 7.6 | 70 | 30 |
| Example 55 | Arginine 2.0% | 2-Methyl-2,4-pentanediol 5% | 7.6 | 70 | 30 |
| Example 56 | — | — | 7.8 | 70 | 30 |
| Example 57 | — | — | 8.0 | 70 | 30 |
| Example 58 | Arginine 2.0% | — | 8.0 | 70 | 30 |
| Example 59 | Histidine 2.0% | — | 8.0 | 70 | 30 |
| Example 60 | — | — | 8.5 | 70 | 30 |
| Example 61 | Arginine 2.0% | — | 8.5 | 70 | 30 |
| Example 62 | — | — | 9.0 | 70 | 30 |
| Comparative Example 1 | — | — | 2.3 | 60 | 30 |
| Comparative Example 2 | — | — | 4.5 | 70 | 30 |
| Comparative Example 3 | — | — | 6.0 | 70 | 30 |
| Comparative Example 4 | — | — | 7.6 | 70 | 30 |
| Comparative Example 5 | — | — | 7.6 | 70 | 30 |
| Comparative Example 6 | — | — | 10.0 | 70 | 30 |
| Comparative Example 7 | — | — | 12.0 | 70 | 30 |

The '%' for (component b), (component d), (component e), and (component g) in Tables 1 to 3 above means wt %, and the 'remainder' for (component a) means the remainder that makes the total of all components of (component a) to (component e) and (component g) 100 wt %. Furthermore, '(pH adjustment)' for (component c) means that (component c) is added so as to achieve the pH value as shown in Tables 1 to 3. (Component c) in each Example and Comparative Example was added in the range of 1 to 10 wt % relative to the total weight of the cleaning composition, and an amount that achieves the pH value shown in Tables 1 to 3 was added.

Moreover, in Table 3 above, Comparative Example 1 corresponds to Example 2 described in Japanese registered patent No. 3871257.

TABLE 4

|  | Via pattern A | | Via pattern B | | Wiring pattern | |
|---|---|---|---|---|---|---|
|  | Removal of residue on surface around via hole | TiN corrosion in bottom of via hole | Removal of residue on surface around via hole | Al corrosion in bottom of via hole | Removal of residue on side face/upper face of wiring | Al corrosion |
| Example 1 | Good | Good | Good | Good | Excellent | Good |
| Example 2 | Good | Good | Good | Good | Excellent | Excellent |
| Example 3 | Good | Excellent | Excellent | Excellent | Excellent | Excellent |
| Example 4 | Excellent | Excellent | Excellent | Excellent | Excellent | Excellent |
| Example 5 | Excellent | Good | Excellent | Good | Excellent | Good |
| Example 6 | Excellent | Good | Excellent | Good | Excellent | Good |
| Example 7 | Excellent | Good | Excellent | Good | Excellent | Good |
| Example 8 | Excellent | Excellent | Excellent | Excellent | Excellent | Excellent |
| Example 9 | Excellent | Excellent | Excellent | Good | Excellent | Excellent |
| Example 10 | Excellent | Good | Excellent | Good | Excellent | Good |
| Example 11 | Excellent | Good | Excellent | Good | Excellent | Good |
| Example 12 | Excellent | Good | Excellent | Good | Excellent | Good |
| Example 13 | Excellent | Good | Excellent | Good | Excellent | Good |
| Example 14 | Excellent | Good | Excellent | Good | Excellent | Good |
| Example 15 | Excellent | Good | Excellent | Good | Excellent | Good |
| Example 16 | Excellent | Good | Excellent | Good | Excellent | Good |
| Example 17 | Good | Excellent | Excellent | Good | Excellent | Good |
| Example 18 | Good | Excellent | Excellent | Excellent | Excellent | Excellent |
| Example 19 | Good | Excellent | Excellent | Good | Excellent | Good |
| Example 20 | Good | Excellent | Excellent | Excellent | Excellent | Excellent |
| Example 21 | Good | Excellent | Excellent | Good | Excellent | Excellent |
| Example 22 | Good | Excellent | Excellent | Excellent | Excellent | Excellent |
| Example 23 | Good | Excellent | Excellent | Excellent | Excellent | Excellent |

TABLE 4-continued

|  | Via pattern A | | Via pattern B | | Wiring pattern | |
| --- | --- | --- | --- | --- | --- | --- |
|  | Removal of residue on surface around via hole | TiN corrosion in bottom of via hole | Removal of residue on surface around via hole | Al corrosion in bottom of via hole | Removal of residue on side face/upper face of wiring | Al corrosion |
| Example 24 | Excellent | Excellent | Excellent | Excellent | Excellent | Excellent |
| Example 25 | Good | Excellent | Excellent | Excellent | Excellent | Excellent |
| Example 26 | Excellent | Excellent | Excellent | Excellent | Excellent | Excellent |
| Example 27 | Good | Excellent | Excellent | Excellent | Excellent | Excellent |
| Example 28 | Excellent | Excellent | Excellent | Excellent | Excellent | Excellent |
| Example 29 | Excellent | Excellent | Excellent | Excellent | Excellent | Excellent |
| Example 30 | Excellent | Excellent | Excellent | Excellent | Excellent | Excellent |
| Example 31 | Excellent | Excellent | Excellent | Excellent | Excellent | Excellent |
| Example 32 | Excellent | Excellent | Excellent | Excellent | Excellent | Good |
| Example 33 | Excellent | Excellent | Excellent | Excellent | Excellent | Good |
| Example 34 | Excellent | Excellent | Excellent | Excellent | Excellent | Excellent |

TABLE 5

|  | Via pattern A | | Via pattern B | | Wiring pattern | |
| --- | --- | --- | --- | --- | --- | --- |
|  | Removal of residue on surface around via hole | TiN corrosion in bottom of via hole | Removal of residue on surface around via hole | Al corrosion in bottom of via hole | Removal of residue on side face/upper face of wiring | Al corrosion |
| Example 35 | Excellent | Excellent | Excellent | Excellent | Excellent | Excellent |
| Example 36 | Excellent | Excellent | Excellent | Excellent | Excellent | Excellent |
| Example 37 | Excellent | Excellent | Excellent | Excellent | Excellent | Excellent |
| Example 38 | Excellent | Excellent | Excellent | Excellent | Excellent | Excellent |
| Example 39 | Excellent | Excellent | Excellent | Excellent | Excellent | Excellent |
| Example 40 | Excellent | Excellent | Excellent | Excellent | Excellent | Excellent |
| Example 41 | Excellent | Excellent | Excellent | Excellent | Excellent | Excellent |
| Example 42 | Excellent | Excellent | Excellent | Excellent | Excellent | Excellent |
| Example 43 | Excellent | Excellent | Excellent | Excellent | Excellent | Excellent |
| Example 44 | Excellent | Excellent | Excellent | Excellent | Excellent | Excellent |
| Example 45 | Excellent | Excellent | Excellent | Excellent | Excellent | Excellent |
| Example 46 | Excellent | Excellent | Excellent | Excellent | Excellent | Excellent |
| Example 47 | Excellent | Excellent | Excellent | Excellent | Excellent | Excellent |
| Example 48 | Excellent | Excellent | Excellent | Excellent | Excellent | Excellent |
| Example 49 | Excellent | Excellent | Excellent | Excellent | Excellent | Excellent |
| Example 50 | Excellent | Excellent | Excellent | Excellent | Excellent | Excellent |
| Example 51 | Excellent | Excellent | Excellent | Excellent | Excellent | Excellent |
| Example 52 | Excellent | Excellent | Excellent | Excellent | Excellent | Good |
| Example 53 | Excellent | Excellent | Excellent | Excellent | Excellent | Excellent |
| Example 54 | Excellent | Excellent | Excellent | Excellent | Excellent | Excellent |
| Example 55 | Excellent | Excellent | Excellent | Excellent | Excellent | Excellent |
| Example 56 | Excellent | Excellent | Excellent | Excellent | Excellent | Excellent |
| Example 57 | Excellent | Excellent | Excellent | Good | Excellent | Good |
| Example 58 | Excellent | Excellent | Excellent | Excellent | Excellent | Excellent |
| Example 59 | Excellent | Excellent | Excellent | Excellent | Excellent | Excellent |
| Example 60 | Excellent | Excellent | Excellent | Good | Excellent | Fair |
| Example 61 | Excellent | Excellent | Excellent | Excellent | Excellent | Excellent |
| Example 62 | Excellent | Excellent | Excellent | Good | Excellent | Fair |
| Comp. Ex. 1 | Poor | Good | Poor | Good | Excellent | Good |
| Comp. Ex. 2 | Poor | Good | Poor | Good | Excellent | Good |
| Comp. Ex. 3 | Fair | Good | Fair | Good | Good | Good |
| Comp. Ex. 4 | Fair | Good | Fair | Good | Fair | Poor |
| Comp. Ex. 5 | Poor | Good | Poor | Good | Fair | Excellent |
| Comp. Ex. 6 | Excellent | Fair | Excellent | Poor | Excellent | Poor |
| Comp. Ex. 7 | Excellent | Poor | Excellent | Poor | Excellent | Poor |

As shown in Tables 4 and 5 above, in Examples 1 to 62 employing the cleaning composition of the present invention, there was no corrosion of Al and TiN, and excellent removability of photoresist and plasma etching residue and ashing residue was exhibited.

Furthermore, from the results of evaluation of Examples 4 to 21, it can be seen that even when the organic acid used is changed, excellent cleaning properties and corrosion prevention can be obtained. Among them, Example 4, in which citric acid was used as the organic acid, exhibited the best results.

Furthermore, from the results of evaluation of Examples 22 to 27, it can be seen that the addition of a water-soluble organic solvent, which is an optional component, further improves prevention of corrosion of a metal.

Moreover, from the results of evaluation of Examples 28 to 30, it can be seen that the use of a plurality of organic acids in combination is preferable.

Furthermore, from the results of evaluation of Examples 31 to 34, it can be seen that even when the hydroxylamine and/or a salt thereof used is changed, excellent cleaning properties and corrosion prevention can be obtained.

Moreover, from the results of evaluation of Examples 35 to 40, it can be seen that even when the basic organic compound used is changed, excellent cleaning properties and corrosion prevention can be obtained.

Furthermore, from the results of evaluation of Examples 41 to 50, it can be seen that both in a case in which an organic amine is used as a basic organic compound and a case in which an organic amine and a quaternary ammonium hydroxide are used in combination as basic organic compounds, excellent cleaning properties and corrosion prevention can be obtained.

Moreover, from the results of evaluation of Examples 51 to 53, it can be seen that even when the pH is 7.6, which is relatively high, excellent cleaning properties and corrosion prevention can be obtained.

Furthermore, from the results of evaluation of Example 54, it can be seen that even when a water-soluble organic solvent, which is an optional component, is contained together with essential components, excellent cleaning properties and corrosion prevention can be obtained. Moreover, from the results of evaluation of Example 55, it can be seen that even when an amino group-containing carboxylic acid and a water-soluble organic solvent, which are optional components, are contained together with essential components, excellent cleaning properties and corrosion prevention can be obtained.

Furthermore, when comparing the results of evaluation of Example 57 with the results of evaluation of Examples 58 and 59, when the pH of the cleaning composition is 8 or greater, in accordance with the use of an amino group-containing carboxylic acid, prevention of corrosion of Al is improved. From a comparison of the results of evaluation of Example 60 with the results of evaluation of Example 61, the same can also be seen.

Moreover, in cleaning employing the cleaning composition of the present invention, the immersion temperature and the immersion time can be selected relatively freely, and cleaning at a low temperature for a short time is possible. Furthermore, in cleaning employing the cleaning composition of the present invention, corrosion of Al and TiN did not progress even under forcing conditions of an extended immersion time.

On the other hand, as shown in Table 5 above, in Comparative Example 1, the cleaning properties for the via pattern were poor. Furthermore, as shown in Comparative Examples 2 and 3, merely increasing the pH relative to Comparative Example 1 could not sufficiently improve the cleaning properties for the via pattern.

Moreover, in Comparative Example 4, in which no organic acid was used, corrosion of Al occurred.

Furthermore, in Comparative Example 5, in which neither a hydroxylamine nor a salt thereof was used, sufficient cleaning properties could not be obtained for either the via pattern or the wiring pattern.

Moreover, in Comparative Examples 6 and 7, in which the pH exceeded 9, corrosion of Al and TiN occurred.

Furthermore, in all the Comparative Examples, even when the immersion time and the immersion temperature were adjusted, sufficient removability and corrosion prevention were not exhibited. In order to achieve a balance between residue removal and corrosion prevention, it was necessary to employ the composition and pH described in the Examples.

The invention claimed is:

1. A cleaning composition for removing plasma etching residue and/or ashing residue formed above a semiconductor substrate, the composition comprising:
   (component a) water;
   (component b) a hydroxylamine sulfate;
   (component c) a basic organic compound; and
   (component d) an organic acid;
   the composition having a pH of 7.2 to 9;
   wherein component a is contained at 50 to 99.5 wt % relative to the total weight of the cleaning composition,
   component b is contained at 0.01 to 30.0 wt % relative to the total weight of the cleaning composition,
   component c is contained at 0.01 to 20.0 wt % relative to the total weight of the cleaning composition,
   component d is contained at 0.01 to 20.0 wt % relative to the total weight of the cleaning composition,
   component b is the only inorganic acid salt in the composition, and
   component d is citric acid and/or malic acid.

2. The cleaning composition according to claim 1, wherein component c is at least one compound selected from the group consisting of an organic amine and a quaternary ammonium hydroxide.

3. The cleaning composition according to claim 2, wherein component c is an organic amine having no hydroxy group.

4. The cleaning composition according to claim 2, wherein component c is a tetraalkylammonium hydroxide.

5. The cleaning composition according to claim 1, wherein the pH is 7.2 to 8.5.

6. The cleaning composition according to claim 5, wherein the pH is 7.2 to 8.4.

7. The cleaning composition according to claim 1, wherein it further comprises (component e) an amino group-containing carboxylic acid.

8. The cleaning composition according to claim 7, wherein component e is histidine and/or arginine.

9. The cleaning composition according to claim 7, wherein component e is contained at 0.01 to 5.0 wt % relative to the total weight of the cleaning composition.

10. Use of the cleaning composition according to claim 1 as a cleaning composition for removing plasma etching residue and/or ashing residue.

11. A cleaning process comprising:
    a preparation step of preparing the cleaning composition according to claim 1; and
    a cleaning step of cleaning, by means of the cleaning composition, plasma etching residue and/or ashing residue formed above a semiconductor substrate.

12. The cleaning process according to claim 11, wherein the semiconductor substrate comprises aluminum and/or copper.

13. A process for producing a semiconductor device, the process comprising:
    an etching step of subjecting a semiconductor substrate to plasma etching; and/or,
    an ashing step of subjecting a resist above the semiconductor substrate to ashing; and
    a cleaning step of cleaning, by means of the cleaning composition according to claim 1, plasma etching residue and/or ashing residue formed above the semiconductor substrate in the etching step and/or the ashing step.

14. The process for producing a semiconductor device according to claim 13, wherein the semiconductor substrate comprises aluminum and/or copper.

15. A cleaning composition for removing plasma etching residue and/or ashing residue formed above a semiconductor substrate, the composition comprising:
(component a) water;
(component b) a hydroxylamine sulfate;
(component c) a basic organic compound; and
(component d) an organic acid;
the composition having a pH of 7.2 to 9;
wherein component a is contained at 50 to 99.5 wt % relative to the total weight of the cleaning composition,
component b is contained at 0.01 to 30.0 wt % relative to the total weight of the cleaning composition;
component c is contained at 0.01 to 20.0 wt % relative to the total weight of the cleaning composition,
component d is citric acid and/or malic acid, and
component b is the only inorganic acid salt in the composition.

16. A cleaning composition for removing plasma etching residue and/or ashing residue formed above a semiconductor substrate, the composition comprising:
(component a) water;
(component b) a hydroxylamine sulfate;
(component c) a basic organic compound; and
(component d) an organic acid;
the composition having a pH of 7.2 to 8.5;
wherein component a is contained at 50 to 99.5 wt % relative to the total weight of the cleaning composition,
component b is contained at 0.01 to 30.0 wt % relative to the total weight of the cleaning composition,
component c is contained at 0.01 to 20.0 wt % relative to the total weight of the cleaning composition,
component b is the only inorganic acid salt in the composition, and
component d is citric acid and/or malic acid.

17. The cleaning composition according to claim 16, wherein the pH is 7.2 to 8.4.

* * * * *